United States Patent [19]

Andros et al.

[11] Patent Number: 5,519,936
[45] Date of Patent: May 28, 1996

[54] METHOD OF MAKING AN ELECTRONIC PACKAGE WITH A THERMALLY CONDUCTIVE SUPPORT MEMBER HAVING A THIN CIRCUITIZED SUBSTRATE AND SEMICONDUCTOR DEVICE BONDED THERETO

[75] Inventors: Frank E. Andros, Binghamton; James R. Bupp, Endwell; Michael DiPietro, Vestal; Richard B. Hammer, Apalachin, all of N.Y.

[73] Assignee: International Business Machines Corporation, Armonk, N.Y.

[21] Appl. No.: 382,330

[22] Filed: Feb. 1, 1995

Related U.S. Application Data

[62] Division of Ser. No. 188,185, Jan. 28, 1994, abandoned.

[51] Int. Cl.$^6$ .................................................. H05K 3/34
[52] U.S. Cl. .................. 29/840; 174/52.4; 174/52.5; 257/666; 437/211; 437/220
[58] Field of Search ..................... 29/840, 830, 825; 427/96; 174/16.3, 52.4, 52.5; 437/211, 220

[56] References Cited

U.S. PATENT DOCUMENTS

| | | | |
|---|---|---|---|
| 4,649,418 | 3/1987 | Uden . | |
| 4,766,670 | 8/1988 | Gazdik et al. | 29/830 |
| 4,868,349 | 9/1989 | Chia | 174/52.4 |
| 4,890,152 | 12/1989 | Hirata et al. | 174/52.5 X |
| 4,992,850 | 2/1991 | Corbett et al. . | |
| 5,023,202 | 6/1991 | Long et al. | 437/206 |
| 5,032,543 | 7/1991 | Black et al. | 437/219 |
| 5,045,921 | 9/1991 | Lin . | |
| 5,095,404 | 3/1992 | Chao | 361/385 |
| 5,114,880 | 5/1992 | Lin | 437/217 |
| 5,133,118 | 7/1992 | Lindblad et al. | 29/840 |
| 5,168,430 | 12/1992 | Nitsch et al. | 361/398 |
| 5,220,487 | 6/1993 | Patel et al. | 174/16.3 X |
| 5,263,245 | 11/1993 | Patel et al. | 29/840 |
| 5,285,352 | 2/1994 | Pastore et al. | 174/16.3 X |

FOREIGN PATENT DOCUMENTS

| 276387 | 2/1990 | Germany | 29/840 |
|---|---|---|---|

OTHER PUBLICATIONS

Research Disclosure, Feb. 1991, No. 322, "Wire Bonded Chips Mounted to Dynamic Flex Cables (Directly to Stiffener)", Author Anonymous.
"Card Assembly Implication in Using the TBGA Module", May 18, 1993, P. Mescher.
"Area Array Tab Package Technology", F. Andros and R. Hammer.
IBM Technical Disclosure Bulletin, vol. 31, No. 8, Jan. 1989, pp. 135–138, "Thin Film Module", by Chen et al.

*Primary Examiner*—Carl J. Arbes
*Attorney, Agent, or Firm*—Lawrence R. Fraley

[57] ABSTRACT

An electronic package which includes a rigid support member, e.g., copper sheet, to which is bonded both the package's semiconductor chip and circuitized substrate members. The chip is bonded using a thermally conductive adhesive while the circuitized substrate, preferably a flexible circuit, is bonded using an electrically insulative adhesive. The chip is electrically coupled to designated parts of the circuitry of the substrate, preferably by wire, thermocompression or thermosonic bonding. An encapsulant may be used to cover and protect the connections between the chip and substrate. This package may in turn be electrically coupled to a separate, second substrate such as a PCB.

9 Claims, 3 Drawing Sheets

5,519,936

METHOD OF MAKING AN ELECTRONIC PACKAGE WITH A THERMALLY CONDUCTIVE SUPPORT MEMBER HAVING A THIN CIRCUITIZED SUBSTRATE AND SEMICONDUCTOR DEVICE BONDED THERETO

This is a divisional of application Ser. No. 08/188,185 filed on Jan. 28, 1994, now abandoned.

TECHNICAL FIELD

The invention relates to electronic packages and more particularly to such packages which utilize circuitized substrates and semiconductors devices (chips) as part thereof. Even more particularly, the invention relates to such electronic packages for use in the information handling systems (computer) field.

BACKGROUND OF THE INVENTION

Electronic packages which utilize semiconductor chips as part thereof are known in the computer industry, with examples being shown and described in U.S. Pat. No. 4,004,195 (Hatayala et al.); U.S. Pat. No. 4,415,025 (Horvath); U.S. Pat. No. 4,593,342 (Lindsay); U.S. Pat. No. 4,914,551 (Anschel et al.); U.S. Pat. No. 4,962,416 (Jones et al.) and U.S. Pat. No. 5,278,724 (Angulas et al.). With particular attention to U.S. Pat. Nos. 4,593,342 and 4,914,551 patents, the semiconductor chip is electrically coupled to a flexible, thin circuitized substrate which in turn is electrically coupled to a second substrate such as a printed circuit board (PCB). The semiconductor chip is, in turn, thermally connected to a separate heat sinking member to provide heat sinking for the heat generated by the chip during operation. These six patents are incorporated herein by reference.

It is understood that a main objective of those in the modern electronic packaging industry is to significantly increase the circuit densities of various elements (e.g., semiconductor chips and circuitized substrates) which form part of these packages. Such increased densities mandate the effective removal of increased heat which is generated during operation by the semiconductor chips, such heat removal being essential to maintain chip temperatures in a range which results in high chip reliability and to thereby promote the operational life of the overall package. Such high densities further mandate that effective means of electrically coupling the chip associated circuitry (e.g., of the circuitized substrate(s) as part thereof) be provided in an effective manner.

As defined herein, the electronic package of the present invention represents a compact structure particularly adapted for having high circuit density semiconductor devices and associated circuitized substrates as part thereof. Further, the package as defined herein is capable of providing such unique features (high power dissipation capabilities and excellent electrical performance) in a structure that can be assembled in a relatively facile and inexpensive manner. Even further, the structure as defined herein is adapted for accepting a variety of different semiconductor chip configurations and associated circuitized substrate structures, thus providing a much desired versatility for such a package. Even further, the invention as defined herein is readily adaptable to a variety of chip attach manufacturing processes (e.g., wire, thermocompression and/or thermosonic bonding, soldering, etc.).

It is believed that an electronic package possessing the features mentioned above, and others discernable in the teachings provided herein, represents a significant advancement in the electronic packaging field. It is also believed that a new and unique method for making such a package would constitute a contribution to this field.

DISCLOSURE OF THE INVENTION

It is, therefore, a primary object of the invention to enhance the art of electronic packaging by providing an electronic package possessing the several advantageous features defined herein.

It is another object of the invention to provide a method of making such an electronic package.

In accordance with one aspect of the invention, there is defined an electronic package which comprises a substantially rigid, thermally conductive support member, a thin, circuitized substrate bonded to the support member in an electrically insulative manner, and a semiconductor device also bonded to the support member. The thin, circuitized substrate includes a dielectric member having at least one layer of circuitry, while the semiconductor device is bonded to the support member in a thermally conductive manner at a location relative to the circuitry of the thin circuitized substrate. The semiconductor device is electrically coupled to the circuitized substrate's circuitry.

In accordance with another aspect of the invention, there is defined a method of making an electronic package wherein the method comprises the steps of providing a substantially rigid, thermally conductive support member, directly bonding to this support member a thin, circuitized substrate, bonding a semiconductor device to the thermally conductive support member in a thermally conductive manner, and electrically coupling the semiconductor device to circuitry which forms part of the thin, circuitized substrate. The thin, circuitized substrate is bonded to the thermally conductive support member in an electrically insulative manner.

BEST MODE FOR CARRYING OUT THE INVENTION

For a better understanding of the invention, together with other and further objects, advantages and capabilities thereof, reference is made to the following disclosure and appended claims in connection with the above-described drawings.

Figure 1:
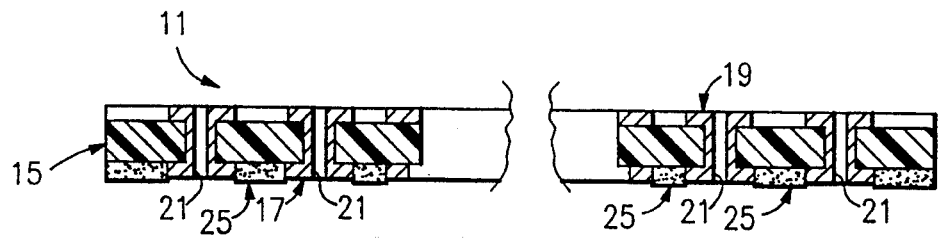
FIG. 1 illustrates one embodiment of a thin, circuitized substrate for use in the present invention.

In FIG. 1, there is shown one example of a thin, circuitized substrate 11 adapted for use in the electronic package 13 (FIG. 4) in accordance with one embodiment of the invention. Thin substrate 11 preferably comprises a dielectric member 15 in the form of a relatively thin (e.g., from about 0.001 inch to about 0.005 inch thick) layer of dielectric material, a preferred type being polyimide. Known examples of such materials as available on the market include Kapton (a trademark of E. I. dupont deNemours and Company) and Upilex (a trademark of Ube Industries). Substrate 11 preferably includes at least one layer 17 of circuitry which may be formed in accordance with known photolithographic methods in the industry. Typically, such circuitry will include copper or similar connective metal as part thereof. In the embodiment depicted in FIG. 1, substrate 11 further includes a second conductive layer 19 on an opposite side of dielectric member 15 from first layer 17. This second layer of circuitry is also of similar material as layer 17 and formed in accordance with known processes. Interconnection of both layers 17 and 19 may be accomplished using plated through-holes (PTH's) 21 or other suitable means. Formation of PTH's of this type may be accomplished in accordance with known procedures and further description is not believed necessary.

In the embodiment of a circuitized substrate as shown in FIG. 1 it is understood that one layer (e.g., 17) may electrically serve as a signal layer while the opposite layer (e.g., 19) may serve primarily as a ground layer, The respective layers each may possess a thickness within the range of from about 0.0005 inch to about 0.002 inch, thus forming a substrate 11 having an overall thickness of from about 0.002 inch to about 0.009 inch. It is thus understood that such a structure is considered to be very thin.

Figure 2:
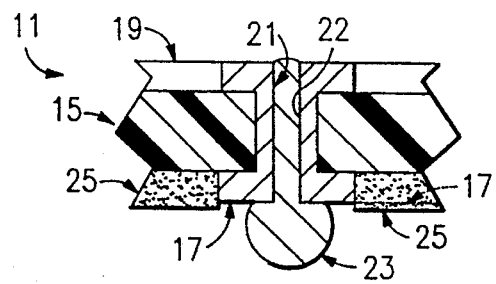
FIG. 2 represents a much enlarged, partial sectional view of the substrate of FIG. 1, having a solder element attached thereto.

In FIG. 2, substrate 11 (only partially shown) is shown to further include a solder element 23, which, as indicated, is positioned in electrical contact with a respective PTH 21. It is possible in the present invention to provide solder elements 23 for each of the several PTH's used in substrate 11. Accordingly, FIG. 2 is representative of but one of several of such elements and is not meant to limit the invention. In one example of the invention, substrate 11 included a total of 736 PTH's 21 and a correspondingly similar number of solder elements 23.

Each of the solder elements are preferably bonded to the respective PTH's by a solder fellow operation wherein a pattern of preformed solder balls are aligned with the respective PTH's and the PTH's brought in physical contact therewith, following which heat is applied to cause at least partial melting of the solder balls and capillary movement or the like of such solder through the respective internal openings 22 (FIG. 2). A preferred solder is 10:90 tin:lead solder. Alternatively, it is within the scope of the invention to form such solder connections utilizing a plurality of solder paste elements (e.g., of 37:63 tin:lead solder) and positioning the respective PTH's 21 thereover at a very slight distance from said paste elements. Heat can then be applied, causing the paste elements to "ball up" to engage the respective PTH. Heat suitable for the above solder operations is preferably within the range of about 170 degrees Celsius (C) to about 225 degrees C. Attention is directed to U.S. Pat. No. 5,133,495 (Angulas et al.) wherein use of paste which "balls up" to form a connection, albeit between a pair of circuitized substrates (e.g., a PCB and flexible circuit), is defined. This patent is also incorporated herein by reference.

Figure 4:
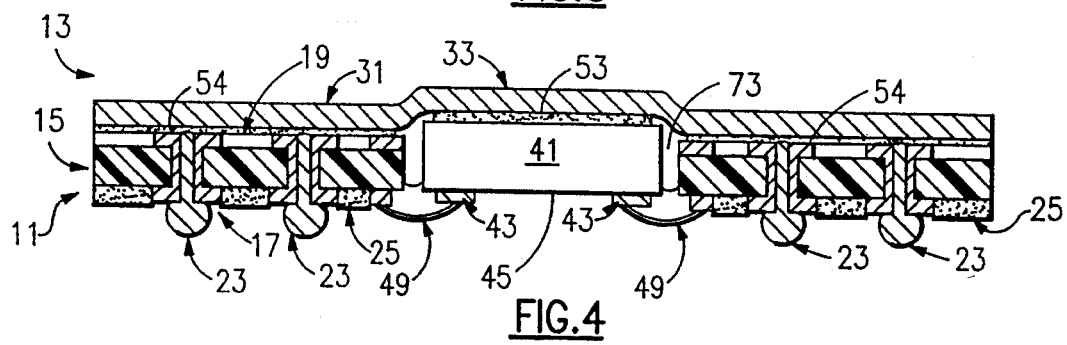
Figure 5:
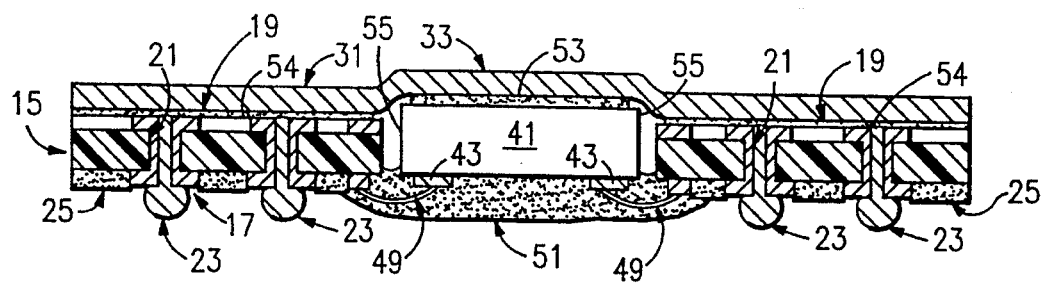
Figure 6:
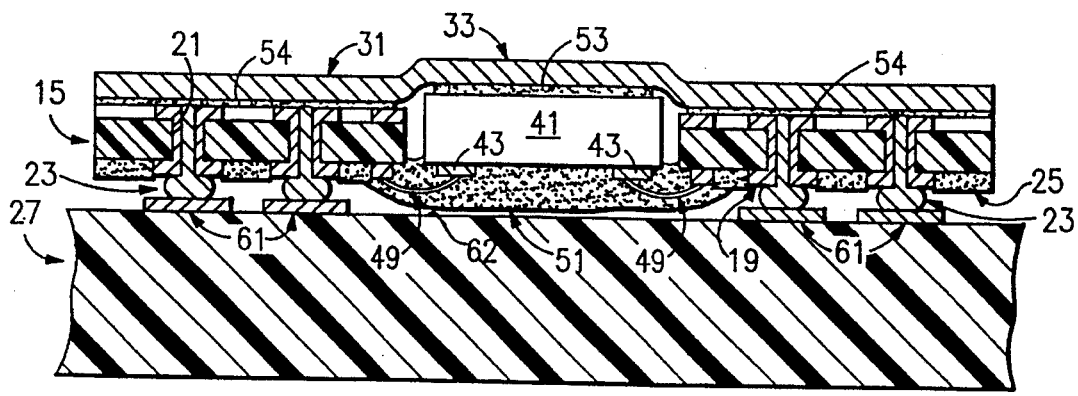

Prior to application of the above solder elements to substrate 11, a coating 25 of protective material may be applied to cover selected portions of the circuitry layer 17. One example of such a material is a modified version of a polymer resin sold under the name Scotchcast (a product available from the Minnesota Mining & Manufacturing Co.). Scotchcast typically includes about 47% by weight of an epoxy polymer, about 52% by weight of a hardener and flexibilizer mixture and about 0.4% by weight of a coloring agent. The hardener and flexibilizer mixture contains about 25–39% of a hexahydrophthalic anhydride, about 50–75% by weight polypropylene glycol and/or polyoxypropylene glycol flexibilizer, about 0.85–1.0% by weight of a tertiary amine and a minor amount of hexahydrophthalic acid. Such a material is known in the art and further description in not deemed necessary. The purpose of this protective coating is to protect circuitry 17 during subsequent processing steps, such as, e.g., joining of the finished package as shown in FIGS. 4 and 5 to a second, external substrate such as PCB 27 (FIG. 6). Such coating protects against possible ionic contaminants from forming on the Circuitry which could adversely affect (e.g., cause shorting of) this circuitry in final operation. The aforementioned heating step is preferably achieved using hot air application or by placing the elements within a suitable oven. Should an oven be utilized, solder attachment of substrate 11 to a PCB was shown to occur at a time period of about 1.5–5 minutes when applying the aforementioned temperatures. Regarding the utilization of solder paste, if desired, a preferred paste for use with the invention is available from Alpha Metals, Inc.

Figure 3:
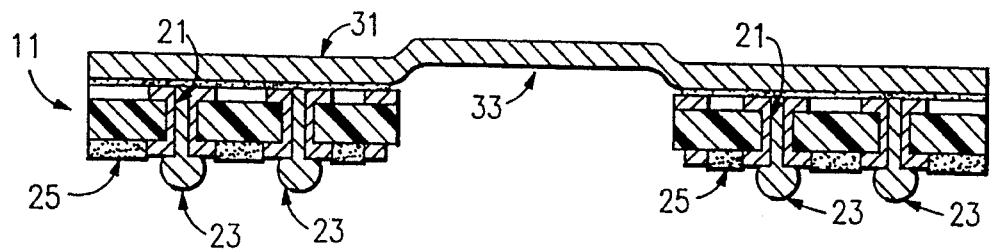
FIGS. 3–6 represent various steps in producing an electronic package in accordance with one embodiment of the invention, including, in FIG. 6, coupling the circuitized substrate to a second circuitized substrate using the aforemention solder elements.

In FIG. 3, circuitized substrate 11, having solder elements 23 in position, is bonded directly to a thermally conductive support member 31. Member 31, as shown, is of elongated, substantially planar configuration and, preferably, includes an indentation 33 therein. Member 31 is preferably a singular metallic sheet of an excellent thermal conductive material, e.g., copper. In a preferred embodiment, member 31 is formed from a copper sheet having an original thickness of about 0.020 inch. Of such a thickness, member 31 is thus substantially rigid to thereby serve as a stiffener member for the final package structure to thereby assure substantial planarity of the thin circuitized substrate (which, without support, would be flexible and easily bendable) When substrate 11 is bonded thereto. This represents an important feature of the invention, such that planarity of substrate 11 can be effectively maintained in the structure as shown in FIG. 5 (and FIG. 8), particularly because this structure is to be subsequently subjected to additional processing such as solder attachment to an external substrate (FIGS. 6 and 9).

Substrate 11 is bonded to member 31 using an electrically insulative adhesive. In accordance with a preferred embodiment of the invention, one adhesive successfully used in the invention was comprised of a thin layer of polyimide having a thin silicone adhesive coating on one or both sides thereof. As seen in FIG. 3 (as well as FIGS. 4–6 and 8–10), the thin circuitized substrate 11 is bonded to support member 31 along the upper surface of tile substrate having second layer 19 thereon, including along the portion of dielectric member 15 having the through-holes 21 therein.

In FIG. 4, a semiconductor chip 41 is shown as also being bonded directly to support member 31, preferably at the location of indentation 33. Chip 41 may be selected from known chips in the art and may thus be of several different sizes, all of which may readily be adapted for use as part of the present invention. Chip 41 is preferably bonded to member 31 using an excellent thermally conductive adhesive, such as the aforedefined modified Scotchcast product from the Minnesota Mining & Manufacturing Co. Should it be desired to electrically couple chip 41 to support member 31, e.g., as an electrical ground, the selected adhesive can also be electrically conductive. As shown in FIG. 4, chip 41 further includes a plurality of electrical contact sites 43 positioned on an external surface 45 thereof. Use of such sites 43 for semiconductor chips is well known and further description is not believed necessary. As shown in FIG. 4, these sites 43 are substantially planar and, in the orientation shown in FIG. 4, are preferably substantially coplanar with the relatively positioned (adjacent) layer 17 of circuitry on substrate 11. Alternatively, the chip may be positioned deeper relative to substrate 15, such that the plane of sites 43 is more recessed than shown herein. This is considered a significant feature of the invention in that it facilitates subsequent electrical coupling between the respective sites 43 and corresponding parts (e.g., conductive lines or pads) which form a part of the layer 17.

In FIG. 4, the preferred means for providing such a coupling is to use a wire bonding operation, examples of which are well known in the art. Further description is not believed necessary. It is also within the scope of the invention to use thermosonic, thermocompression, laser and laser sonic bonding, or other types of bonding to provide this coupling between the respective conductive wires (49) and corresponding conductive elements being coupled. Typically, such conductive wiring 49 may be of aluminum or gold material.

Following the aforementioned electrical coupling, it is preferred to add a quantity of encapsulant 51 (FIG. 5) to substantially cover the external surface 45 of chip 41 and the associated conductive wiring 49, as well as portions of the adjacent circuitry layer 17. One example of such an encapsulant is Hysol FP4511, a flowable, liquid epoxy gel material which features low viscosity and low stress. (Hysol is a trademark of Dexter Corp., Olean, N.Y.) This encapsulant, as with the aforementioned wire bonding operation, is preferably accomplished with the substrate and support members being inverted in comparison to the orientation depicted in FIGS. 4 and 5. Encapsulant 51 thus hardens (cures) to the configuration substantially as shown in FIG. 5.

The electronic package structure depicted in FIG. 5 is now ready to be electrically coupled to associated circuitized structures, e.g., a PCB 27, as shown in FIG. 6, to thus further expand the operational capabilities of the invention. In the embodiment of FIG. 5, it is understood that the orientation shown facilitates the flow of heat from chip 41 during component operation through the thermally conductive adhesive (53) to thermal conductor support member 31. The encapsulant 51 shown in FIG. 5 may be extended to totally cover all external surfaces of chip 41, including the surfaces of the chip's sides (55), if necessary. Such extensive encapsulation provides added protection for chip 41.

In FIG. 6, substrate 11 and support member 31 as shown electrically coupled (and positioned on) PCB 27. In a preferred embodiment, PCB 27 includes a plurality of conductors 61 (e.g., copper pads) spacedly positioned on an upper surface 62 thereof in accordance with a fixed pattern comparative to the corresponding pattern of solder balls 23 on substrate 11. The substrate, having solder elements 23 thereon, is lowered to physically engage PCB 27 such that elements 23 physically contact the respective conductors 61. Heat (e.g., at 210 degrees C.) is then applied to at least partially melt solder elements 23 and form a bond with the respective conductors 61. It is within the scope of the present invention to utilize a process as defined in U.S. Pat. No. 5,203,075 (Angulas et al.) wherein a suitable solder paste is applied on the respective conductors and this paste will be physically engaged by the respective solder ball elements 23 and a junction formed. The teachings of U.S. Pat. No. 5,203,075 are thus incorporated herein by reference.

The illustrated conductors 61 may in turn be electrically coupled to internal conductive planes (not shown) within the dielectric material of PCB 27, these planes serving as signal, ground and/or power planes, as is known in the PCB industry. Further description is thus not believed necessary. It is understood that the electronic package structure shown in FIG. 5 is now electrically coupled, to PCB 27 at a plurality of several individual locations. In such an arrangement, PCB 27 may in turn be located within and electrically coupled to an electronic computer, in a manner known in the art (e.g., within a processor cage).

Figure 7:
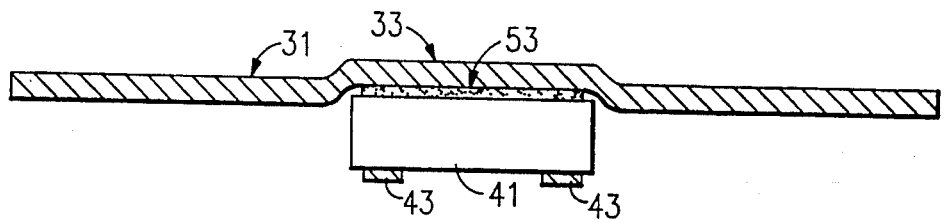
FIGS. 7–9 represent another series of steps for producing an electronic package in accordance with another embodiment of the invention.
Figure 8:
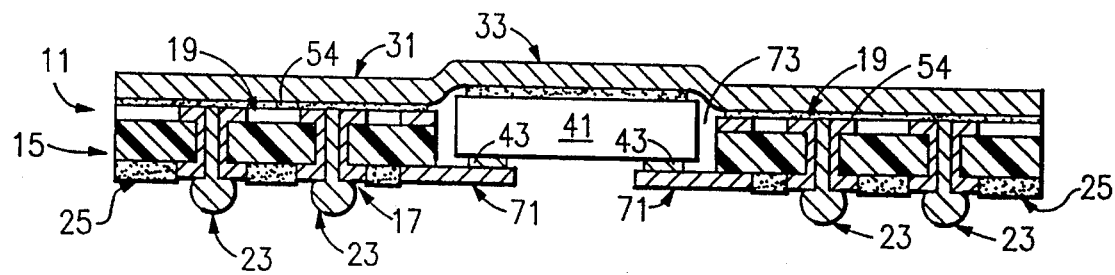
Figure 9:
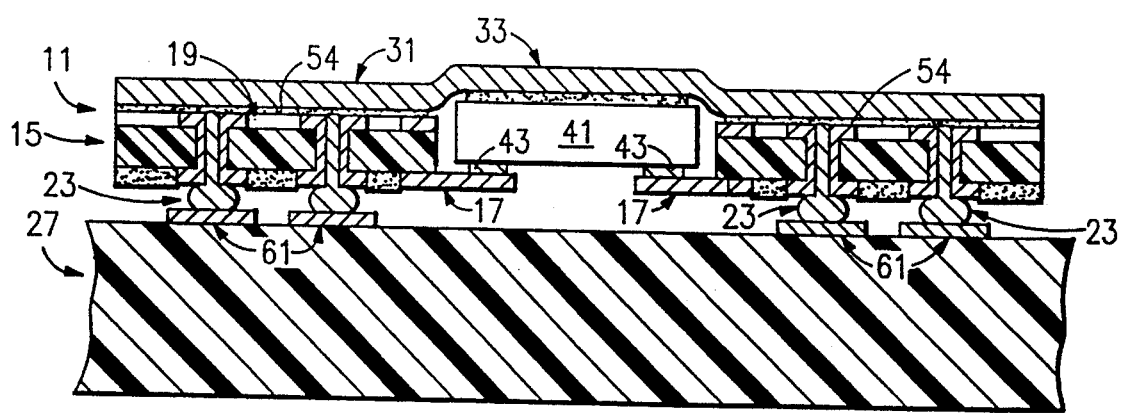

In FIGS. 7–9, there is shown an alternative method of making an electronic package in accordance with an alternative embodiment of the invention. In FIG. 7, chip 41 has been initially bonded to support member 31 (in the location of indentation 33) in a similar manner to the bonding of chip 41 in FIG. 4. As shown, a similar thermally conductive adhesive 53 is utilized with chip 41 securely in position, the substrate (11') then being aligned relative thereto and bonded to member 31, as shown in FIG. 8. Such bonding is accomplished using a similar adhesive as used in the embodiment of FIG. 4. Substrate 11' differs slightly from substrate 11 in FIG. 1 in that the circuit layer 17 preferably includes a plurality of projecting conductor leads 71 as part thereof, these leads 71 extending across the interior opening 73 formed in the substrate. It is also understood that in the preferred embodiment in FIG. 4, substrate 11 also includes a similar aperture or opening 73. Such protecting leads 71 are thus of cantilever orientation relative to the dielectric 15 and are designed for aligning with respective ones of the contact sites 43 on chip 41, when substrate 11' is finally bonded to support member 31. Such alignment may be accomplished using camera or other precise means known in the art. The final coupling of these leads 71 to sites 43 can be accomplished using thermocompression bonding or others previously mentioned above, in accordance with teachings known in the art. Further description is thus not believed necessary.

Prior to the above coupling between the cantilever conductor members 71 and respective contact sites 43, as well as prior to the aforedefined wire bonding in the embodiment of FIG. 4, it is preferred to apply a thin strike layer of precious metal (e.g., gold) to the respective conductors of circuitry 17 as well as on the respective contact sites 43, to electrically enhance connection therebetween.

In FIG. 9, the package of FIG. 8 is shown as being electrically coupled to a PCB 27, this coupling is preferably accomplished in accordance with the same procedure(s) as may be used in the embodiment of FIG. 5.

Figure 10:
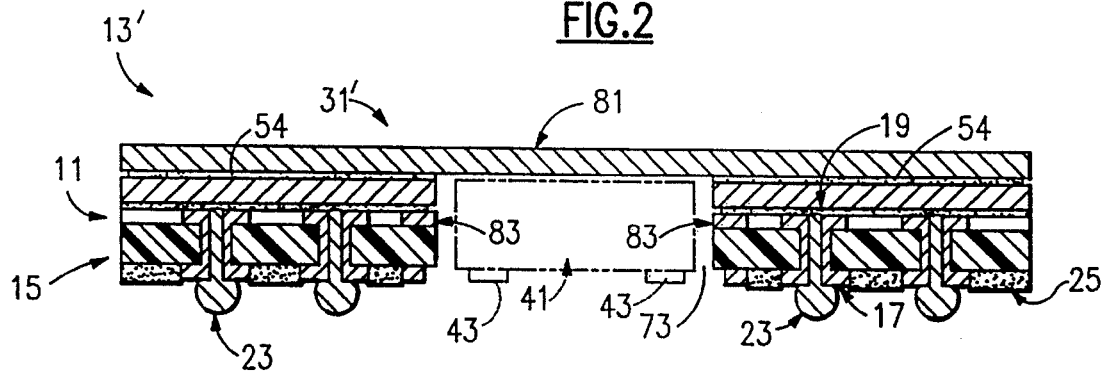
FIG. 10 represents an electric package having a thermally conductive support member in accordance with an alternative embodiment of the invention.

In FIG. 10, there is shown an electronic package 13' in accordance with an alternate embodiment of the invention. Package 13', like package 13 in FIG. 4, includes a circuitized substrate 11 which, in one embodiment of the invention, may be identical to that used in the embodiment of FIG. 4. Alternatively, this substrate may be similar to that of substrate 11' in FIG. 8. In FIG. 10, package 13' includes a thermally conductive support member 31' of different configuration than that in the embodiments described above. Specifically, support member 31' includes a planar base 81, preferably from a singular sheet of metal having a thickness substantially similar to that of support member 31 in the above embodiment, and at least one spacer 83 which, as-shown, is bonded to base 81, preferably using a thermally conductive adhesive such as used above to bond chip 41 to support member 31. In a preferred embodiment, at least two spacer members 83 are utilized to each accommodate a respective portion of substrate 11 thereon. Preferably, substrate 11 is bonded to spacer members 83 using an electrically insulating adhesive (54) similar to that used to bond substrate 11 to member 31 above. In one embodiment, each spacer was also comprised of copper or similar thermally conductive material and had a thickness of only about 0.025 inch. Thus, the spacer and base elements of support member 31' possess a overall thickness of only about 0.029 inch. In the embodiment of FIG. 10, the spacers serve to effectively space the outer layer of circuitry 17 on substrate 11 with respect to the external surface and position contact sites 43 of chip 41 (shown in phantom) when the chip is positioned within the opening 73 defined by substrate 11 and the adjacent spacer members 83. Understandably, chip 41 will thus be positioned within this opening 73 and bonded to the part of base 81 located relative to opening 73. Chip 41 is bonded using a similar thermally conductive adhesive as used to bond chips 41 in FIGS. 4 and 8. Coupling to the respective layer of circuitry 17 may be accomplished using a wire bonding operation as used above (FIG. 4) or, alternatively, substrate 11 may include cantilever conducting lead members as utilized in the embodiment of FIG. 8.

Thus, there have been shown and described an electronic package and method of making same wherein the package's semiconductor chip and thin circuitized substrate members are both bonded to a common thermally conductive support member which, as defined, serves as both a heat sinking member and a stiffener member to provide substantially rigid support for the thin circuitized substrate thereon. The package as defined facilitates positioning of the semiconductor chip relative to at least one layer on this circuitry while also assuring effective bonding of both chip and circuitized substrate in the final package. Still further, such a package is readily adapted for subsequent placement and coupling to a separate conductive substrate such as a PCB or the like.

While there have been shown and described what are at present considered the preferred embodiments of the invention, it will be obvious to those skilled in the art that various modifications and changes may be made therein without departing from the scope of the invention as defined by the appended claims.

What is claimed is:

1. A method of making an electronic package, said method comprising:

providing a substantially rigid, thermally conductive support member;

directly bonding at least one thin, circuitized substrate to said thermally conductive support member in an electrically insulative manner, said thin, circuitized substrate including a dielectric member having at least one layer of circuitry;

bonding a semiconductor device to said thermally conductive support member in a thermally conductive manner at a location relative to said layer of circuitry;

electrically coupling said semiconductor device to said circuitry of said thin, circuitized substrate; and substantially covering at least part of said semiconductor device and at least part of said circuitry with an encapsulant.

2. The method of claim 1 wherein said bonding of said thin, circuitized substrate to said thermally conductive member is accomplished using an adhesive.

3. The method of claim 1 wherein said bonding of said semiconductor device to said thermally conductive support member is accomplished using an adhesive.

4. The method of claim 1 wherein said electrical coupling of said semiconductor device to said circuitry of said thin, circuitized substrate is accomplished using a wire bonding operation.

5. The method of claim 1 wherein said electrical coupling of said semiconductor device to said circuitry of said thin, circuitized substrate is accomplished using a thermocompression bonding operation.

6. The method of claim 1 wherein said bonding of said semiconductor device to said thermally conductive support member occurs subsequent to said bonding of said thin, circuitized substrate to said thermally conductive support member.

7. The method of claim 1 further including providing an indentation in said thermally conductive support member and thereafter bonding said semiconductor device to said support member, said semiconductor device being bonded to said support member at the location of said indentation.

8. The method of claim 1 further including the step of securing a plurality of solder elements to selected portions of said layer of circuitry of said thin, circuitized substrate.

9. The method of claim 8 further including providing a second circuitized substrate and electrically coupling said thin, circuitized substrate to said second circuitized substrate, said electrical coupling being accomplished using said solder elements.

* * * * *